US012224001B2

(12) United States Patent
Huang et al.

(10) Patent No.: US 12,224,001 B2
(45) Date of Patent: Feb. 11, 2025

(54) LAYOUT PATTERN OF STATIC RANDOM ACCESS MEMORY AND THE FORMING METHOD THEREOF

(71) Applicant: UNITED MICROELECTRONICS CORP., Hsin-Chu (TW)

(72) Inventors: Chun-Hsien Huang, Tainan (TW); Yu-Tse Kuo, Tainan (TW); Shu-Ru Wang, Taichung (TW); Li-Ping Huang, Miaoli County (TW); Yu-Fang Chen, Taipei (TW); Chun-Yen Tseng, Tainan (TW); Tzu-Feng Chang, Tainan (TW); Chun-Chieh Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 237 days.

(21) Appl. No.: 18/071,658

(22) Filed: Nov. 30, 2022

(65) Prior Publication Data

US 2024/0161818 A1 May 16, 2024

(30) Foreign Application Priority Data

Nov. 10, 2022 (TW) .................................. 111142911

(51) Int. Cl.
*G11C 11/412* (2006.01)
*H01L 29/66* (2006.01)
*H01L 29/78* (2006.01)
*H10B 10/00* (2023.01)

(52) U.S. Cl.
CPC ........ *G11C 11/412* (2013.01); *H01L 29/6681* (2013.01); *H01L 29/7851* (2013.01); *H10B 10/12* (2023.02)

(58) Field of Classification Search
CPC ............... G11C 11/412; H01L 29/6681; H01L 29/7851; H01L 21/823431; H01L 21/845; H01L 27/0886; H01L 27/0924; H01L 27/1211; H01L 27/0207; H10B 10/12; H10B 10/18
See application file for complete search history.

(56) References Cited

U.S. PATENT DOCUMENTS 8,315,084 B2 * 11/2012 Liaw ..................... G11C 11/412
                                                       365/189.11
9,425,201 B2   8/2016 Liaw
9,728,541 B1 *  8/2017 Huang ................ H01L 29/6681
9,941,288 B2   4/2018 Huang

* cited by examiner

*Primary Examiner* — Allison Bernstein
(74) *Attorney, Agent, or Firm* — Winston Hsu

(57) ABSTRACT

The invention provides a layout pattern of static random access memory (SRAM), which at least comprises a plurality of gate structures located on a substrate and spanning the plurality of fin structures to form a plurality of transistors distributed on the substrate, wherein the plurality of transistors comprise two pull-up transistors (PU), two pull-down transistors (PD) to form a latch circuit, and two access transistors (PG) connected to the latch circuit. In each SRAM memory cell, the fin structure included in the pull-up transistor (PU) is defined as a PU fin structure, the fin structure included in the pull-down transistor (PD) is defined as a PD fin structure, and the fin structure included in the access transistor (PG) is defined as a PG fin structure, wherein a width of the PD fin structure is wider than a width of the PG fin structure.

10 Claims, 6 Drawing Sheets

US 12,224,001 B2

LAYOUT PATTERN OF STATIC RANDOM ACCESS MEMORY AND THE FORMING METHOD THEREOF

BACKGROUND OF THE INVENTION

1. Field of the Invention

The present invention relates to a static random access memory (SRAM), in particular to a layout pattern of SRAM with high performance and the forming method thereof

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The invention provides a layout pattern of static random access memory (SRAM), which at least comprises a substrate, and a plurality of SRAM memory cells are arranged on the substrate, wherein each SRAM memory cell comprises a plurality of fin structures located on the substrate, a plurality of gate structures located on the substrate and spanning the fin structures to form a plurality of transistors distributed on the substrate, each transistor includes a part of the gate structure spanning the fin structure, and the transistors include two pull-up transistors (PU), two pull-down transistors (PD) to form a latch circuit, and two access transistors (PG) connected to the latch circuit. In any SRAM memory cell, the fin structure included in the pull-up transistor (PU) is defined as a PU fin structure, the fin structure included in the pull-down transistor (PD) is defined as a PD fin structure, and the fin structure included in the access transistor (PG) is defined as a PG fin structure, wherein a width of the PD fin structure is wider than a width of the PG fin structure.

The invention also provides a method for forming the layout pattern of static random access memory (SRAM), which at least comprises: providing a substrate, forming a plurality of SRAM memory cells arranged on the substrate, wherein each SRAM memory cell comprises a plurality of fin structures located on the substrate, a plurality of gate structures located on the substrate and spanning the fin structures to form a plurality of transistors distributed on the substrate, each transistor includes a part of the gate structure spanning the fin structure, and the transistors include two pull-up transistors (PU), two pull-down transistors (PD) to form a latch circuit, and two access transistors (PG) connected to the latch circuit. In any SRAM memory cell, the fin structure included in the pull-up transistor (PU) is defined as a PU fin structure, the fin structure included in the pull-down transistor (PD) is defined as a PD fin structure, and the fin structure included in the access transistor (PG) is defined as a PG fin structure, wherein a width of the PD fin structure is wider than a width of the PG fin structure.

The present invention is characterized in that, in order to improve the device quality, it is necessary to increase the ratio of the turn-on current of the PD transistor to the turn-on current of the PG transistor (i.e., the bet ratio), but the width of the fin structure formed by spacer imaging transferring (SIT) cannot be adjusted only by the mask pattern. The invention uses the method of adding dummy fin structure to achieve the purpose of controlling the width of fin structure. In addition, the mandrel pattern with a special shape is formed in the invention, so that there are more dummy fins around the PG fin structure, while there are no dummy fins around the PD fin structure. Therefore, after the etching step, the PG fin structure will be subjected to more reflection etching to reduce its width, thus achieving the purpose of improving the beta ratio and static noise tolerance of SRAM.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
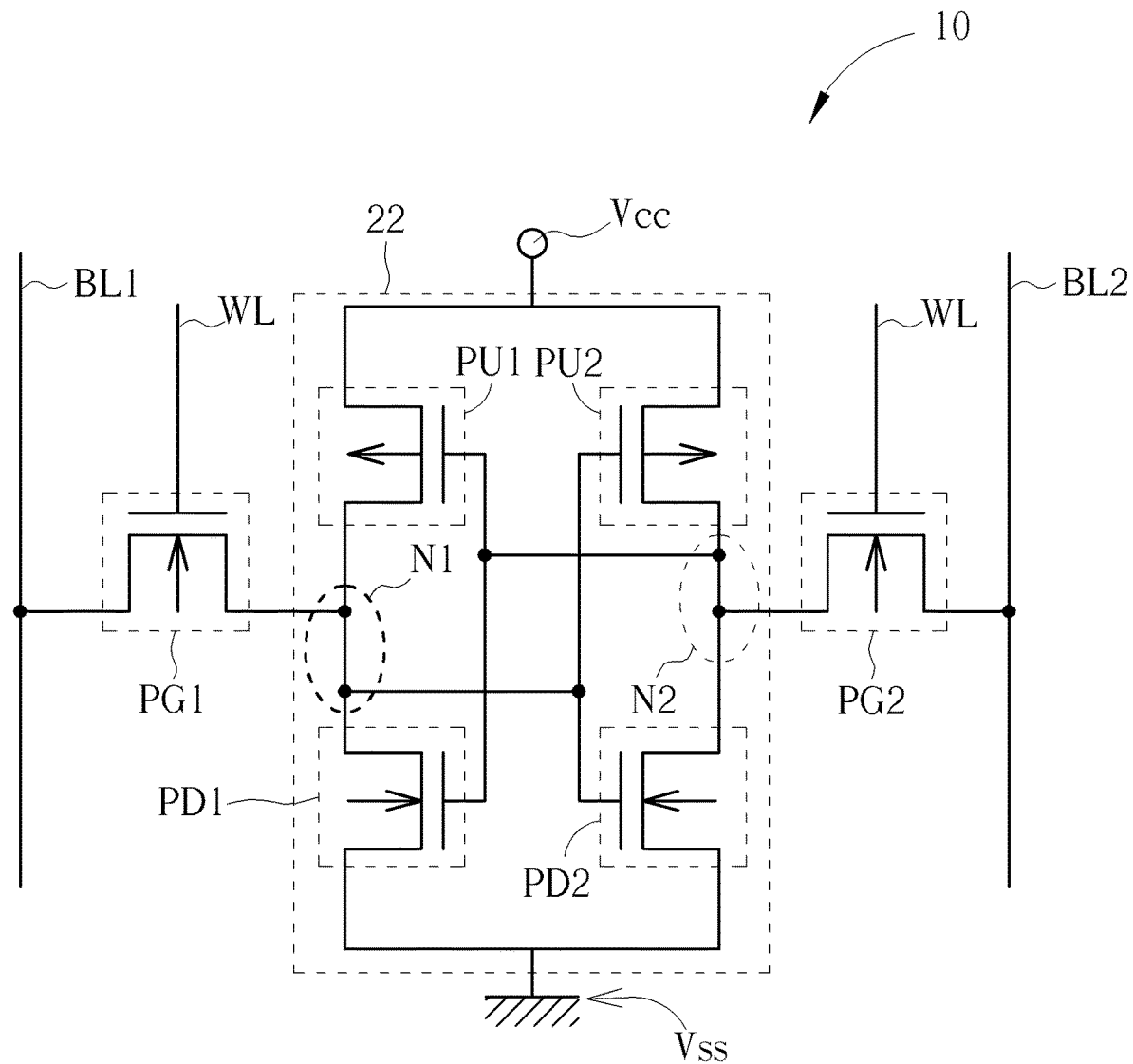
FIG. 1 is a circuit diagram of a six-transistor SRAM (6T-SRAM) memory cell in the SRAM of the present invention.

FIG. 1 is a circuit diagram of a set of six-transistor SRAM (6T-SRAM) memory cell in the SRAM of the present invention. Referring to FIG. 1, in this embodiment, each 6T-SRAM memory cell 10 is preferably composed of a first pull-up transistor PU1, a second pull-up transistor PU2, a first pull-down transistor PD1, a second pull-down transistor PD2, a first access transistor PG1 and a second access transistor PG2 form a flip-flop, in which the first pull-up transistor PU1 and the second pull-up transistor PU2, the first pull-down transistor PD1 and the second pull-down transistor PD2 form a latch circuit 22, so that data can be latched at a storage node N1 or N2. In addition, the first pull-up transistor PU1 and the second pull-up transistor PU2 are used as active loads, and they can also be replaced by common resistors as pull-up transistors, in this case, fourtransistor static random access memory (4T-SRAM). In addition, in this embodiment, the sources of the first pull-up transistor PU1 and the second pull-up transistor PU2 are electrically connected to a voltage source Vcc, and the sources of the first pull-down transistor PD1 and the second pull-down transistor PD2 are electrically connected to a voltage source Vss.

In an embodiment, the first pull-up transistor PU1 and the second pull-up transistor PU2 of the 6T-SRAM memory cell 10 are composed of P-type metal oxide semiconductor (PMOS) transistors. The first pull-down transistor PD1, the second pull-down transistor PD2, the first access transistor PG1 and the second access transistor PG2 are composed of N-type metal oxide semiconductor (NMOS) transistors, but the present invention is not limited to this. The first pull-up transistor PU1 and the first pull-down transistor PD1 form an inverter, and the two ends of the series circuit formed by them are respectively coupled to a voltage source Vcc and a voltage source Vss; Similarly, the second pull-up transistor PU2 and the second pull-down transistor PD2 form another inverter, and the two ends of the series circuit formed by these two transistors are respectively coupled to the voltage source Vcc and the voltage source Vss. The two inverters are coupled to each other to store data.

In addition, at the storage node N1, the gate of the second pull-down transistor PD2, the gate of the second pull-up transistor PU2, and the drain of the pull-down transistor PD1, the drain of the first pull-up transistor PU1 and the drain of the first access transistor PG1 are electrically connected to each other; Similarly, at the storage node N2, the gate of the first pull-down transistor PD1, the gate of the first pull-up transistor PU1, the drain of the second pull-down transistor PD2, the drain of the second pull-up transistor PU2 and the drain of the second access transistor PG2 are electrically connected to each other. The gates of the first access transistor PG1 and the second access transistor PG2 are respectively coupled to a word line WL, and the sources of the first access transistor PG1 and the second access transistor PG2 are respectively coupled to the corresponding bit lines BL1 and BL2.

Figure 2:
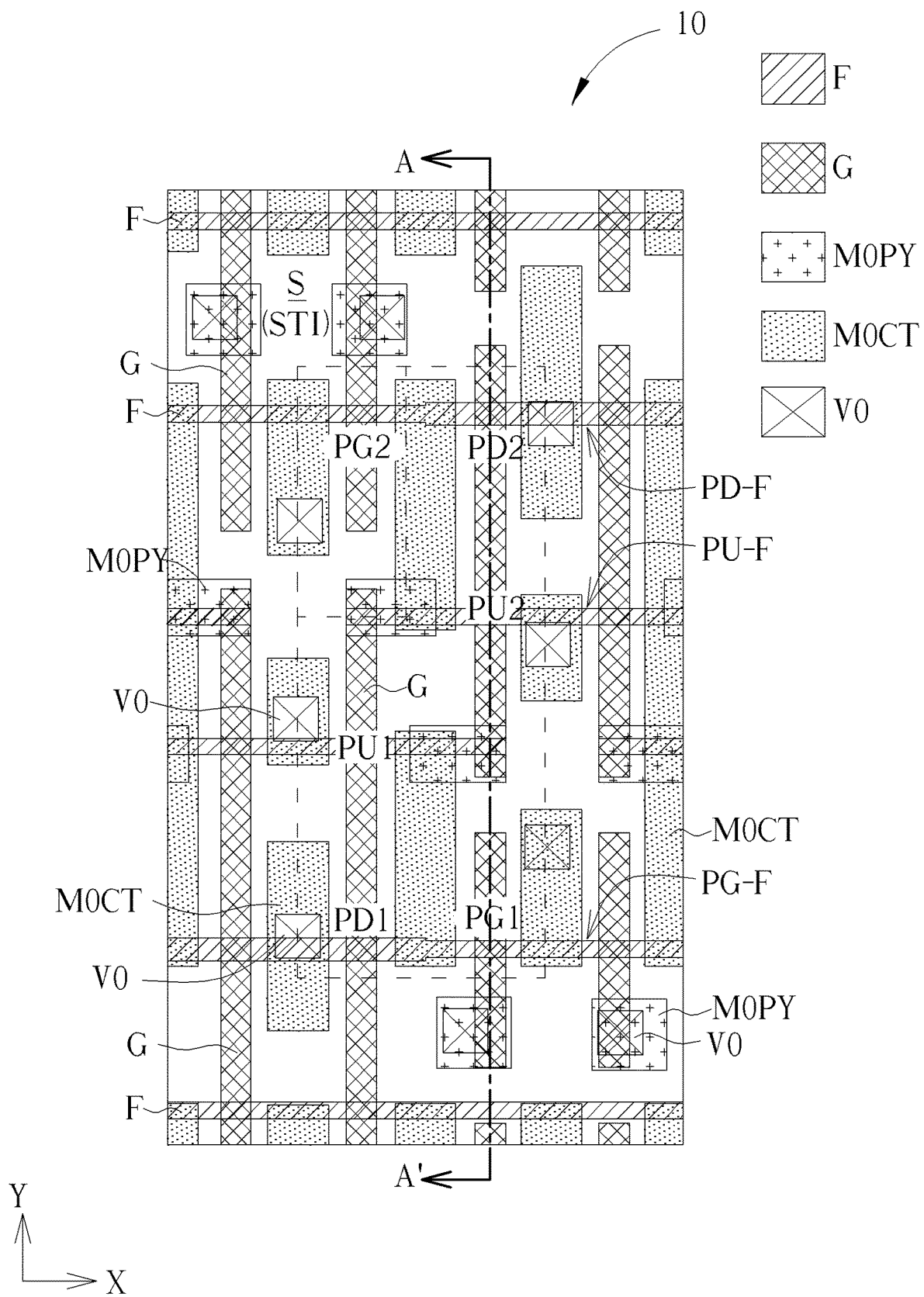
FIG. 2 is a layout diagram of a static random access memory according to the first preferred embodiment of the present invention.

FIG. 2 is a layout diagram of a static random access memory according to the first preferred embodiment of the present invention. In this embodiment, as shown in FIG. 2, the 6T-SRAM memory cell 10 is disposed on a substrate S, such as a silicon substrate or a silicon-on-insulator (SOI) substrate. The substrate S may be a planar structure or provided with a plurality of fin structures F, and a plurality of gate structures G are disposed on the substrate S. In other embodiments of the present invention, it can also be applied to planar SRAM, which means that the doped regions are formed in the substrate instead of the fin structures, and it also belongs to the scope of the present invention.

In addition, the layout of FIG. 2 also includes a plurality of metal layers, where the metal layer partially connecting the gates of each transistor is defined as M0PY, and the metal layer connecting the source/drain of each transistor is defined as M0CT. In FIG. 2, the metal layer M0PY and the metal layer M0CT are represented by different shading. However, the difference between the metal layer M0PY and the metal layer M0CT is that the connected components are different. Both of them actually belong to metal layers and can contain the same material, but the present invention is not limited thereto. FIG. 2 also includes a plurality of contact plugs (via) V0, wherein the contact plugs V0 are used to connect the metal layers M0PY and M0CT to other conductive layers (such as M1, V1, M2, etc., which are common in semiconductor manufacturing processes) formed subsequently.

In the layout pattern of the present invention, a three-dimensional SRAM is taken as an example (that is, fin structures F are formed instead of planar doped regions). As shown in FIG. 2, on the substrate S, except the positions that the fin structures F, the gate structures G, the metal layers M0PY, the metal layers M0CT and the contact plugs V0 are formed, the rest of the substrate S is covered with an insulating layer, such as a shallow trench isolation (STI), to isolate various electronic components (such as transistors) and avoid short circuit. In addition, each gate structure G straddles part of the fin structure F to form transistors (for example, the first pull-up transistor PU1, the second pull-up transistor PU2, the first pull-down transistor PD1, the second pull-down transistor PD2, the first access transistor PG1 and the second access transistor PG2). For clarity of the drawing, the positions of the above transistors are directly marked on FIG. 2, especially at the intersection of the gate structure G and the fin structure F.

As shown in FIG. 2, for the convenience of the following description, the fin structures F crossed by the gate structures G in different transistors in the 6T-SRAM memory cell 10 are defined as different names, including: in the first pull-up transistor PU1 and the second pull-up transistor PU2, the fin structures F crossed by the gate structures G are defined as the PU fin structures (PU-F), in the first pull-down transistor PD1 and the second pull-down transistor PD2, the fin structure F crossed by the gate structure G is defined as the PD fin structure (PD-F), while in the first access transistor PG1 and the second access transistor PG2, the fin structure F crossed by the gate structure G is defined as the PG fin structure (PG-F). Significantly, the PD fin structure (PD-F) and the PG fin structure (PG-F) may be different parts of one same fin structure, that is to say, one part of a fin structure F is defined as the PD fin structure (PD-F), while the other part is defined as the PG fin structure (PG-F).

One of the purposes of the present invention is to improve the static noise margin (SNM) of a SRAM, where the static noise margin is related to the beta ratio (P ratio) of SRAM. In which the beta ratio is equal to the ratio of the turn-on current of the transistor PD to the turn-on current of the transistor PG. In other words, if the turn-on current of transistor PD is increased or the turn-on current of transistor PG is decreased, the beta ratio and static noise tolerance can be increased.

According to the following transistor equation 1, it can be found that the current passing through the transistor is proportional to the channel width W, and when the gate structure G crosses the fin structure F, the channel width W of the transistor is related to the width of the fin structure F. In other words, if the width of the gate structure F is increased, the current through the transistor will also be increased, whereas if the width of the gate structure F is decreased, the current through the transistor will also be decreased.

$$I=\mu_n C_{ox} W/L[(V_{GS}-V_{th})V_{DS}-V^2_{DS}/2] \quad \text{Equation 1}$$

wherein:
  I is the current passing through the transistor;
  W is the gate width (the channel width) of the transistor;
  L is the gate length (the channel length) of the transistor;
  $\mu_n$ is the carrier mobility;
  Co is the unit capacitance of the gate oxide layer;

$V_{GS}$ is the voltage from the gate to the source;
$V_{DS}$ is the voltage from the drain to the source; and
$V_{th}$ is the threshold voltage.

As mentioned above, if the width of the PD fin structure (PD-F) can be increased or the width of the PG fin structure (PG-F) can be decreased, the beta ratio can be increased. However, with the progress of the manufacturing process, most of the current fin structures are formed by sidewall image transfer (SIT) process, so the width of the fin structures cannot be directly controlled by changing the mask pattern, and other ways are needed to achieve the purpose of changing the width of the fin structure.

Generally speaking, in order to improve the uniformity of the whole device pattern and avoid errors caused by excessive pattern density difference, except for the normal fin structure F, some dummy fin structures DF will also be formed next to the fin structure F. These dummy fin structures DF are not actually connected with other electronic components. However, the applicant found that the arrangement position and density of the dummy fin structure DF will affect the width of the finally formed fin structure F. More specifically, the applicant found that if many dummy fin structures DF are arranged around one fin structure F, when the etching step to remove or reduce the dummy fin structures DF (for example, a dry etching step, such as reactive ion etching, but not limited to this) is performed, the etching step may reflect more times, so the width of the fin structure F may be reduced together. On the contrary, if the dummy fin structure DF is not included around one fin structure F, the etching reflection will be reduced, so the fin structure F can keep its original width. In other words, the width of the fin structure F (including the PU fin structure (PU-F), the PD fin structure (PD-F) and the PG fin structure (PG-F)) can be controlled by adjusting the arrangement position of the dummy fin structures DF.

Figure 3:
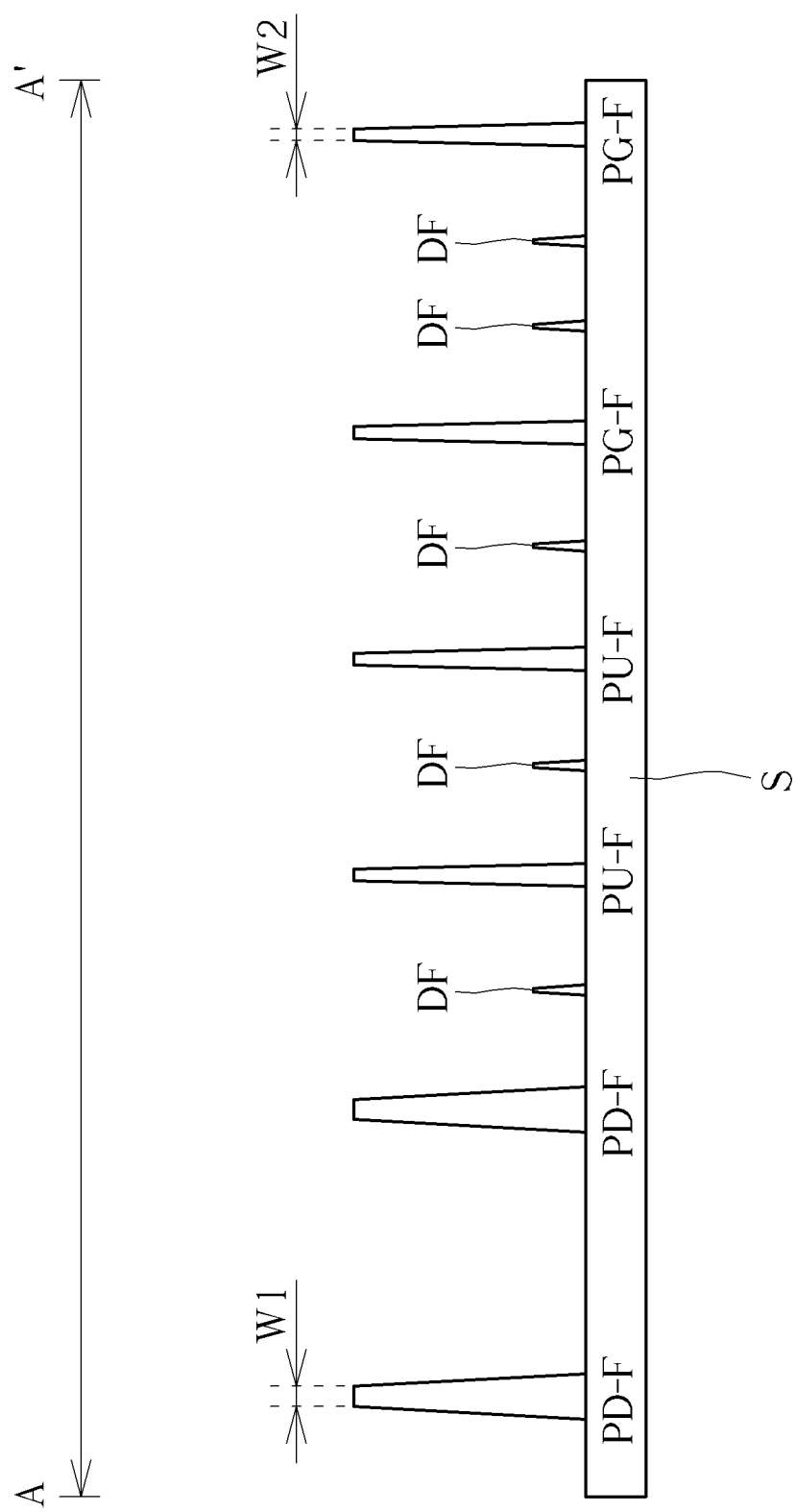
FIG. 3 is a schematic cross-sectional structure along the section line A-A' in FIG. 2, with emphasis on the fin structures and the dummy fin structures.

Therefore, the present invention achieves the purpose of controlling the widths of the PU fin structure (PU-F), the PD fin structure (PD-F) and the PG fin structure (PG-F) by adding and adjusting the position of dummy fin structure DF. FIG. 3 is a schematic diagram of the sectional structure along the sectional line A-A' in FIG. 2, emphasizing the fin structures and the dummy fin structures. In order to simplify the explanation FIG. 3 focuses on the distribution of the fin structures, and other elements such as gate structure G, metal layer M0PY and metal layer M0CT are omitted and not drawn. Referring to FIG. 3, the present invention is characterized in that the width of the PD fin structure (PD-F) is larger than the width of the PG fin structure (PG-F). That is, the width of the PD fin structure (PD-F) is defined as W1, while the width of the PG fin structure (PG-F) is defined as W2, where W1>W2. In addition, the width of the PD fin structure (PD-F) is larger than the width of the PU fin structure (PU-F), but it is not limited to this. Except for the above-mentioned PU fin structure (PU-F), the PD fin structure (PD-F) and the PG fin structure (PG-F), the substrate S also contains a plurality of dummy fin structures DF. The height and the width of the dummy fin structure DF are smaller than the height and the width of other fin structures F.

In this embodiment, the dummy fin structures DF are located between the PD fin structure (PD-F) and the adjacent PU fin structure (PU-F), between the PU fin structure (PU-F) and the adjacent PU fin structure (PU-F), between the PU fin structure (PU-F) and the adjacent PG fin structure (PG-F), and also located between the PG fin structure (PG-F) and the adjacent PG fin structure (PG-F), but not between the PD fin structure (PD-F) and the adjacent PD fin structure (PD-F).

As mentioned above, the periphery of the PD fin structure (PD-F) does not contain densely arranged dummy fin structures DF, so its width will not be reduced in the etching process. On the contrary, the widths of other PU fin structures (PU-F) and PG fin structures (PG-F) will be reduced during etching because there are many dummy fin structures around them. In addition, during the etching process, the dummy fin structure DF may only be reduced in size (as shown in FIG. 3), or it may be completely removed in other embodiments (therefore, the dummy fin structure is not included in the cross section), all of which belong to the scope of the present invention. Besides, because the size of the dummy fin structures DF in FIG. 3 are small, so they are not shown in FIG. 2.

FIG. 4 to FIG. 8 are schematic diagrams showing the method for forming the fin structures according to the present invention. Please note that in FIG. 4 to FIG. 8, for the convenience of understanding the position of each transistor, the predetermined position of the gate structure G to be formed later is also marked. However, in fact, when the fin structure F is formed, the gate structure G has not yet been formed, which will be explained here first. In addition, the positions of some PU fin structures (PU-F), PD fin structures (PD-F) and PG fin structures (PG-F) are also marked to facilitate the comparison of transistor positions.

Figure 4:
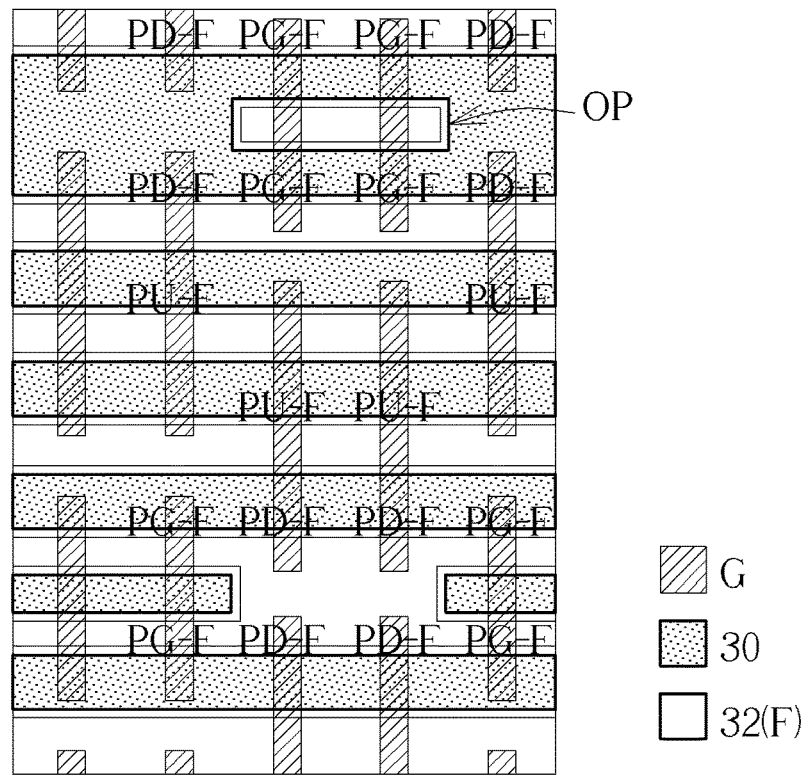
FIG. 4 to FIG. 8 are schematic diagrams showing the method for forming the fin structures according to the present invention.

First, as shown in FIG. 4, a plurality of mandrel patterns 30 are formed on the substrate, and then spacer patterns 32 are formed by deposition and etching back beside the mandrel patterns 30, and the formed spacer patterns 32 will be located around the edge of the mandrel patterns 30. Notably, most of the mandrel patterns 30 are line-shaped, but some of the mandrel patterns 30 are block-shaped and contain holes OP, and the spacer patterns 30 are located at the edge around the mandrel patterns 30 and at the edge inside the holes OP. In this embodiment, the material of the mandrel pattern 30 can be, for example, insulating materials such as silicon oxide and silicon nitride, but it is not limited to this. The spacer pattern 32 is made of, for example, silicon, which can be used as a fin structure F later.

Figure 5:
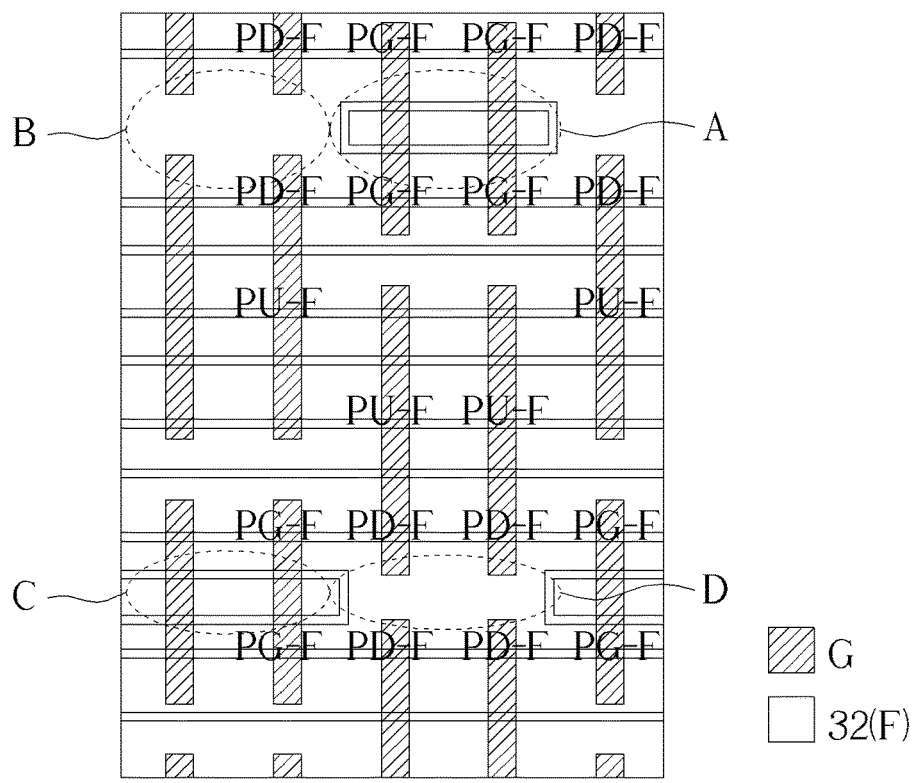

As shown in FIG. 5, the mandrel pattern 30 is removed by an etching step, and the spacer pattern 32 is left. Part of the left spacer pattern 32 will be used as the fin structure F in subsequent steps, and the other part will be reduced or removed as the dummy fin structure DF. Most of the spacer patterns 32 are strip-shaped, while a few spacer patterns 32 are square-shaped. The square spacer patterns 32 can increase the density of the dummy fin structure DF, so that the width of the surrounding fin structure F can be reduced in the subsequent etching process. It should be noted that by designing the shape of the mandrel pattern 30 in FIG. 4, the square spacer pattern 32 can only be located between the PG fin structure (PG-F) and another adjacent PG fin structure (PG-F) (for example, the area A or the area C in FIG. 5), but not between the PD fin structure (PD-F) and another adjacent PD fin structure (PD-F) (for example, the area B or the area D in FIG. 5). Therefore, by designing the mandrel pattern 30, the periphery of the PG fin structure (PG-F) can contain more dummy fin structures DF, while the periphery of the PD fin structure (PD-F) does not contain dummy fin structures DF.

Figure 6:
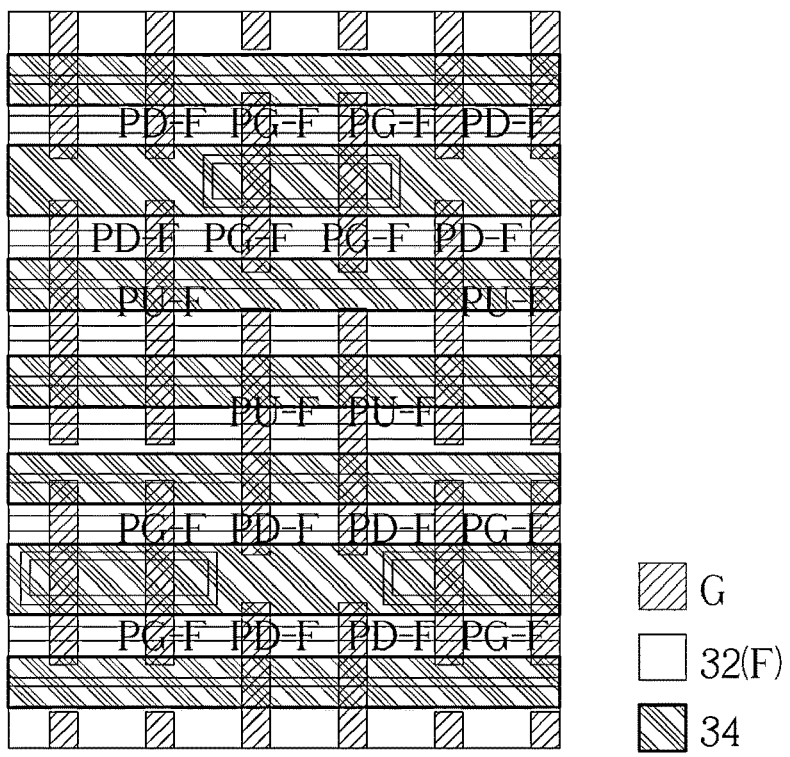

As shown in FIG. 6, an etching step is then performed to remove or reduce the unnecessary spacer pattern 32 (i.e., the dummy fin structures DF). In FIG. 6, a mask 34 indicates the area where the spacer pattern 32 is to be removed or reduced, that is, the spacer pattern 32 (the dummy fin structures DF) in the area covered by the mask 34 will be reduced or removed. As mentioned above, in this etching step, there are more dummy fin structures DF around the PG fin structure (PG-F) or the PU fin structure (PU-F), so the width of the PG fin structure (PG-F) or the PU fin structure (PU-F) will be reduced more, whereas there are no dummy fin structures DF around the PD fin structure PD-F, so the PD fin structure (PD-F) can maintain its original width.

Figure 7:
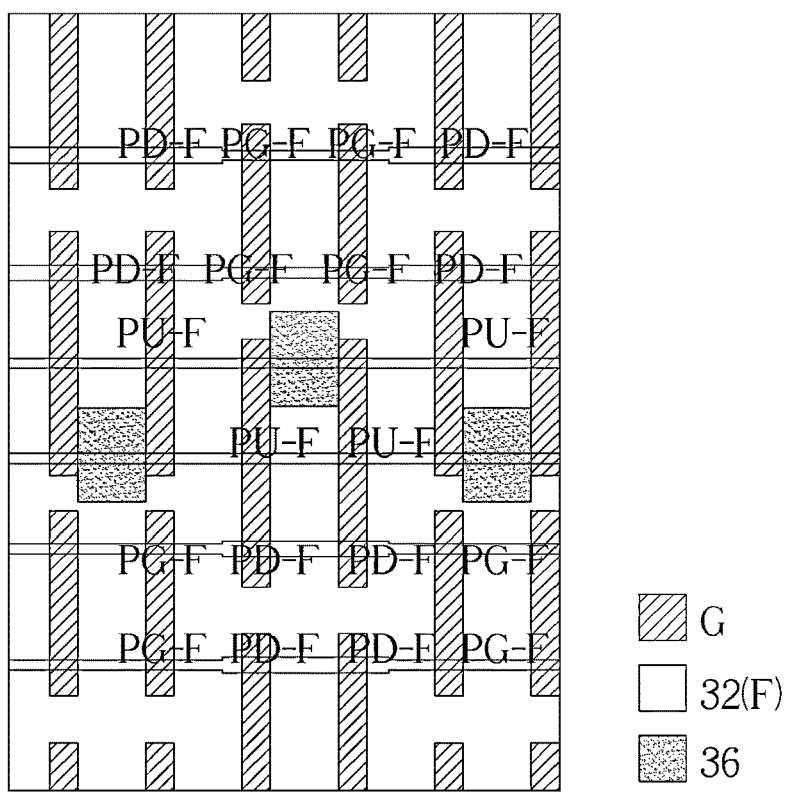
Figure 8:
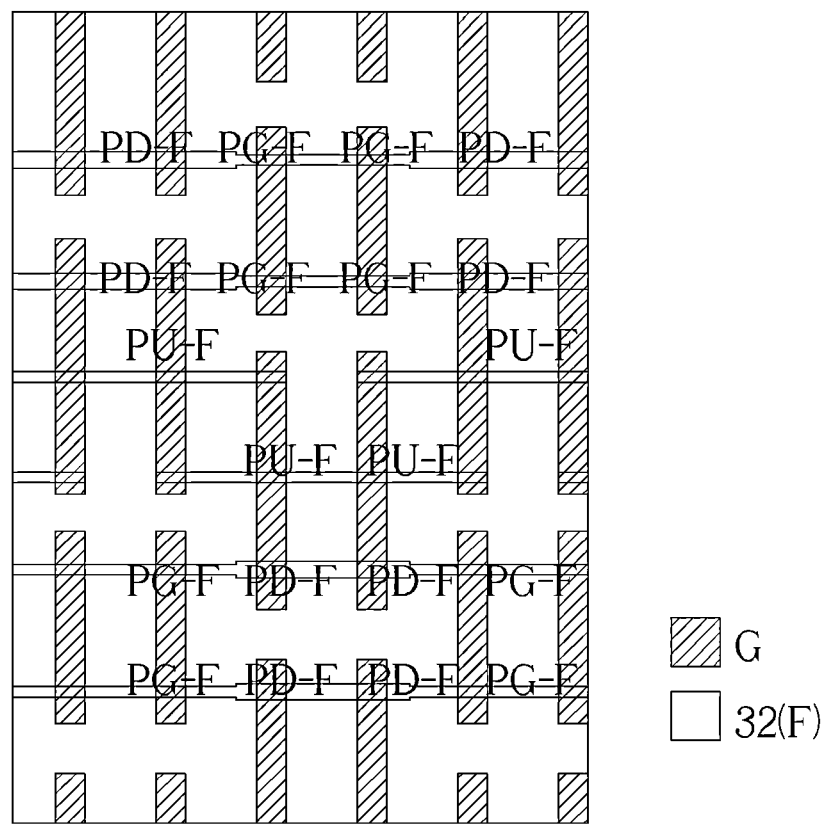

As shown in FIG. 7, part of the left spacer pattern 32 (i.e., the fin structure F) is cut off by another mask 36. FIG. 7 shows that the spacer pattern 32 (the fin structure F) in the area covered by the mask 36 will be removed. Finally, as shown in FIG. 8, the left spacer pattern 32 is the fin structure F, and other devices, such as gate structure, metal layer, contact structure, etc., will be formed in sequence. The SRAM memory cell formed is similar to that shown in FIG. 2, so it is not repeated here.

Therefore, as can be seen from the above FIG. 4 to FIG. 8, in this embodiment, by forming the mandrel pattern 30 with a special shape, the spacer pattern 32 similar to the flame shape can be formed next to the PG fin structure (PG-F) but not next to the PD fin structure (PD-F). Therefore, after the etching step shown in FIG. 6 is performed, the width of the PG fin structure (PG-F) will be partially etched, while the width of the PD fin structure (PD-F) will be kept. Therefore, after the subsequent SRAM memory cell is completed, the current value of PG transistor can be reduced, and the purpose of improving the beta ratio and static noise tolerance can be achieved.

According to the above description and drawings, the present invention provides a layout pattern of static random access memory (SRAM), which at least comprises a substrate S, a plurality of SRAM memory cells 10 arranged on the substrate S, wherein each SRAM memory cell 10 includes a plurality of fin structures F located on the substrate S, a plurality of gate structures G located on the substrate S and spanning the fin structures F to form a plurality of transistors distributed on the substrate, each transistor includes a partial gate structure G spanning a partial fin structure F, and a plurality of transistors include: two pull-up transistors (PU1, PU2), two pull-down transistors (PD1, PD2) to form a latch circuit, and two access transistors (PG1, PG2) connected to the latch circuit, wherein in any SRAM memory cell, the fin structure included in the pull-up transistor (PU) is defined as a PU fin structure (PU-F), the fin structure included in the pull-down transistor (PD) is defined as a PD fin structure (PD-F), and the fin structure included in the access transistor (PG) is defined as a PG fin structure (PG-F), in which a width W1 of the PD fin structure PD-F is wider than a width W2 of the PG fin structure PG-F (please refer to the FIG. 3).

In some embodiments of the present invention, a plurality of dummy fin structures DF are formed on the substrate, and the dummy fin structures DF are located between one PD fin structures PD-F and the adjacent PU fin structures PU-F, or between one PU fin structures PU-F and the adjacent PG fin structures PG-F, or between one PG fin structures PG-F and the adjacent PG fin structures PG-F.

In some embodiments of the present invention, the dummy fin structure DF is not located between the PD fin structure PD-F and the adjacent PD fin structure PD-F.

In some embodiments of the present invention, a height and a width of the dummy fin structure DF are smaller than a height and a width of the PG fin structure PG-F (refer to FIG. 3).

In some embodiments of the present invention, the shortest distance between the PG fin structure PG-F and another adjacent PG fin structure PG-F is greater than the shortest distance between the PG fin structure PG-F and any dummy fin structure DF.

In some embodiments of the present invention, there is a dummy fin structure between the PU fin structure PU-F and another adjacent PU fin structure PU-F, and there is also a dummy fin structure between the PU fin structure PU-F and another adjacent PG fin structure PG-F.

In some embodiments of the present invention, there are two dummy fin structures disposed between the PG fin structure PG-F and another adjacent PG fin structure PG-F.

In some embodiments of the present invention, in any SRAM memory cell, the PG fin structure PG-F and the PD fin structure PD-F are connected to each other and arranged in the same direction (that is, the PG fin structure PG-F and the PD fin structure PD-F are different parts of one fin structure F).

The present invention also provides a method for forming the layout pattern of SRAM, which at least includes providing a substrate S, forming a plurality of SRAM memory cells 10 arranged on the substrate S, wherein each SRAM memory cell 10 includes a plurality of fin structures F located on the substrate S, a plurality of gate structures G located on the substrate S and spanning the fin structures F to form a plurality of transistors distributed on the substrate, each transistor includes a partial gate structure G spanning a partial fin structure F, and a plurality of transistors include: two pull-up transistors (PU1, PU2), two pull-down transistors (PD1, PD2) to form a latch circuit, and two access transistors (PG1, PG2) connected to the latch circuit, wherein in any SRAM memory cell, the fin structure included in the pull-up transistor (PU) is defined as a PU fin structure PU-F, the fin structure included in the pull-down transistor (PD) is defined as a PD fin structure PD-F, and the fin structure included in the access transistor (PG) is defined as a PG fin structure PG-F, in which a width W1 of the PD fin structure PD-F is wider than a width W2 of the PG fin structure PG-F (please refer to the FIG. 3).

In some embodiments of the present invention, the method of forming the dummy fin structures DF further includes forming a plurality of mandrel patterns 30 on the substrate S, forming a plurality of spacer patterns 32 around each mandrel pattern 30, removing each mandrel pattern 30, leaving each spacer pattern 32, and performing an etching step to reduce the size of each spacer pattern 32, wherein the reduced spacer patterns 32 are the dummy fin structures DF.

In some embodiments of the present invention, after each spacer pattern is formed, at least one square spacer pattern 32 is located between the PG fin structure PG-F and the adjacent PG fin structure PG-F (refer to FIG. 5).

In some embodiments of the present invention, the square spacer pattern 32 is not located between the PD fin structure PD-F and the adjacent PD fin structure PD-F (refer to FIG. 5).

To sum up, the present invention is characterized in that, in order to improve the device quality, it is necessary to increase the ratio of the turn-on current of the PD transistor to the turn-on current of the PG transistor (i.e., the bet ratio), but the width of the fin structure formed by spacer imaging transferring (SIT) cannot be adjusted only by the mask pattern. The invention uses the method of adding dummy fin structure to achieve the purpose of controlling the width of fin structure. In addition, the mandrel pattern with a special shape is formed in the invention, so that there are more dummy fins around the PG fin structure, while there are no dummy fins around the PD fin structure. Therefore, after the etching step, the PG fin structure will be subjected to more reflection etching to reduce its width, thus achieving the purpose of improving the beta ratio and static noise tolerance of SRAM.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a layout pattern of a static random access memory (SRAM), at least comprising:
   providing a substrate;
   forming a plurality of SRAM memory cells, which are arranged on the substrate, wherein each SRAM memory cell comprises:
      a plurality of fin structures positioned on the substrate;
      a plurality of gate structures located on the substrate and span the plurality of fin structures to form a plurality of transistors distributed on the substrate, wherein each transistor includes a portion of the gate structure spanning the fin structure, and the plurality of transistors include: two pull-up transistors (PU), two pull-down transistors (PD), which together form a latch circuit, and two access transistors (PG) connected to the latch circuit;
   wherein, in any SRAM memory cell, the fin structure included in the pull-up transistor (PU) is defined as a PU fin structure, the fin structure included in the pull-down transistor (PD) is defined as a PD fin structure, and the fin structure included in the access transistor (PG) is defined as a PG fin structure, wherein a width of the PD fin structure is wider than a width of the PG fin structure;
   forming a plurality of dummy fin structures on the substrate, comprising:
      forming a plurality of mandrel patterns on the substrate;
      forming a plurality of spacer patterns to surround each mandrel pattern;
      removing each mandrel pattern, leaving each spacer pattern, wherein after forming each spacer pattern, at least one square spacer pattern is located between the PG fin structure and the adjacent PG fin structure.

2. The method for forming the layout pattern of the static random access memory (SRAM) according to claim 1, wherein the plurality of dummy fin structures are located between the PD fin structure and the adjacent PU fin structure, between the PU fin structure and the adjacent PU fin structure, between the PU fin structure and the adjacent PG fin structure, or between the PG fin structure and the adjacent PG fin structure.

3. The method for forming the layout pattern of the static random access memory (SRAM) according to claim 2, wherein the dummy fin structure is not located between the PD fin structure and the adjacent PD fin structure.

4. The method for forming the layout pattern of the static random access memory (SRAM) according to claim 2, wherein a height and a width of the dummy fin structure are smaller than a height and a width of the PG fin structure.

5. The method for forming the layout pattern of the static random access memory (SRAM) according to claim 2, wherein a shortest distance between the PG fin structure and another adjacent PG fin structure is larger than a shortest distance between the PG fin structure and any dummy fin structure.

6. The method for forming the layout pattern of the static random access memory (SRAM) according to claim 2, wherein a dummy fin structure is included between the PU fin structure and another adjacent PU fin structure, and another dummy fin structure is included between the PU fin structure and another adjacent PG fin structure.

7. The method for forming the layout pattern of the static random access memory (SRAM) according to claim 2, wherein two dummy fin structures are included between the PG fin structure and another adjacent PG fin structure.

8. The method for forming the layout pattern of the static random access memory (SRAM) according to claim 2, wherein the method for forming the dummy fin structure further comprises:
   removing each mandrel pattern, leaving each spacer pattern; and
   performing an etching step to reduce the size of each spacer pattern, wherein the reduced spacer patterns are the dummy fin structures.

9. The method for forming the layout pattern of the static random access memory (SRAM) according to claim 1, wherein the square spacer pattern is not located between the PD fin structure and the adjacent PD fin structure.

10. The method for forming the layout pattern of the static random access memory (SRAM) according to claim 1, wherein in any SRAM memory cell, the PG fin structure and the PD fin structure are connected to each other and arranged in the same direction.

* * * * *